US009071303B2

(12) United States Patent
Elsayed et al.

(10) Patent No.: US 9,071,303 B2
(45) Date of Patent: Jun. 30, 2015

(54) LEVEL DE-MULTIPLEXED DELTA SIGMA MODULATOR BASED TRANSMITTER

(71) Applicants: Fahmi Elsayed, Calgary (CA);
Mohamed Helaoui, Calgary (CA);
Fadhel Ghannouchi, Calgary (CA);
Mojtaba Ebrahimi, Calgary (CA);
Bradley John Morris, Ottawa (CA)

(72) Inventors: Fahmi Elsayed, Calgary (CA);
Mohamed Helaoui, Calgary (CA);
Fadhel Ghannouchi, Calgary (CA);
Mojtaba Ebrahimi, Calgary (CA);
Bradley John Morris, Ottawa (CA)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 0 days.

(21) Appl. No.: 13/958,088

(22) Filed: Aug. 2, 2013

(65) Prior Publication Data
US 2015/0036766 A1 Feb. 5, 2015

(51) Int. Cl.
*H03M 3/00* (2006.01)
*H04B 1/04* (2006.01)
*H03M 3/02* (2006.01)
*H04B 1/02* (2006.01)

(52) U.S. Cl.
CPC ............... *H04B 1/0475* (2013.01); *H03M 3/02* (2013.01); *H04B 1/02* (2013.01); *H04B 2001/045* (2013.01)

(58) Field of Classification Search
CPC ........... H03M 3/30; H03M 3/02; H03M 3/39; H04B 1/02
USPC ........... 375/247, 259, 286, 295, 297; 341/143
See application file for complete search history.

(56) References Cited

U.S. PATENT DOCUMENTS

| 6,046,649 | A * | 4/2000 | Lange | 332/103 |
|---|---|---|---|---|
| 7,346,122 | B1 * | 3/2008 | Cao | 375/296 |
| 7,570,711 | B1 * | 8/2009 | Chavez et al. | 375/298 |
| 7,606,321 | B2 * | 10/2009 | Pan | 375/295 |
| 8,248,160 | B2 * | 8/2012 | Saed | 330/149 |
| 8,442,466 | B2 * | 5/2013 | Trikha et al. | 455/260 |
| 2004/0264583 | A1 * | 12/2004 | Ahmed | 375/259 |
| 2006/0164273 | A1 * | 7/2006 | Hickling | 341/143 |
| 2007/0247222 | A1 * | 10/2007 | Sorrells et al. | 330/10 |
| 2012/0300858 | A1 * | 11/2012 | Morgan | 375/242 |

FOREIGN PATENT DOCUMENTS

EP 1 282 278 A1 * 6/2003

OTHER PUBLICATIONS

Boulejfen, F. Elsayed, M. Helaoui, L. DeVocht and F. M. Ghannouchi, "Efficiency Enhancement of Sigma—Delta Modulator Based Transmitters Using Multi-Level Quantizers," Journal of Signal Processing Systems, vol. 69: Issue 2, pp. 125-132, Nov. 2012.

Fahmi Elsayed, Mohamed Helaoui and Fadhel M. Ghannouchi "A Linearized Multi-level Cartesian and Envelope •• Modulated Wireless Transmitters Using DLGA Algorithm", IEEE Transactions on Microwave Theory and Techniques, submitted Oct. 2012.

* cited by examiner

*Primary Examiner* — Jean B Corrielus
(74) *Attorney, Agent, or Firm* — Ericsson Canada Inc.

(57) ABSTRACT

This specification discloses a level de-multiplexed DSM based transmitter and a method for providing the same. Broadly embodiments of the present specification enable wireless transmitters that are based on multi-level de-multiplexed DSM. A three-level de-multiplexed DSM based transmitter is disclosed as an example. More generally, the use of m-level de-multiplexed DSM is also taught, the specification thereby being enabling for broader applications to a person skilled in the art. At least one of the efficiency and linearity of transmitters can be enhanced as required for specific applications by a person of skill in the art in view of this specification and the teachings of its disclosed embodiments.

10 Claims, 10 Drawing Sheets

LEVEL DE-MULTIPLEXED DELTA SIGMA MODULATOR BASED TRANSMITTER

BACKGROUND

1. Field of Technology

The present specification relates to transmitters generally, and to delta sigma modulator based transmitters more specifically.

2. Related Art

Due to the excessive demand for higher data rates and more communication services, spectrum efficient modulation and multiplexing techniques, such as code division multiple access (CDMA) and orthogonal frequency division multiplexing (OFDM), are widely used to cope with the ever-increasing cellular traffic within wireless communication networks. These advanced techniques, however, may give rise to communication signals with high peak-to-average-power-ratios (PAPRs). To avoid distortions, the power amplifier (PA) of the wireless transmitter may be required to operate at large back-off from the saturation region, which results in low average efficiency performance.

The delta sigma modulator (DSM) based transmitter is an architecture capable of providing average efficiency enhancement of radio frequency (RF) transmitters. Conventionally, a DSM based transmitter includes a two-level DSM unit that quantizes a time-varying input signal, a signal up-converter that shifts the frequency of the quantized signal to the desired radio frequency (RF) carrier frequency, and a switching mode PA (SMPA) that boosts the power of the RF signal before transmission. Given that the quantized signal has two levels, the envelope of the RF signal feeding the SMPA is constant. As such, no output power back-off may be required; and, the SMPA can be driven at saturation at all times, which may maximize its efficiency. Furthermore, there may be no need for any predistortion techniques, which may reduce the complexity of the digital signal processing part of the transmitter and therefore reduces its energy consumption.

The overall efficiency of DSM based transmitters is determined by the product of the coding efficiency (CE) of the DSM times the peak efficiency of the SMPA. The CE is the ratio between the in-band signal power to the overall quantized signal power. In the case of two-level DSM, the CE is critically low. Thus when the SMPA saturates there is a very low desired output power. As a result, the overall efficiency of two-level DSM based transmitters is very limited.

To surmount this problem, multi-level (three- and higher-level) DSM based transmitters have been proposed. The use of multi-level DSM allows increasing the CE of the quantized signal, which in principle, should significantly improve the overall efficiency of multi-level DSM based transmitters compared to their two-level DSM based counterparts. However, since the quantized multi-level signal is no longer constant-envelope, the SMPA is operated at back-off region most of the time. As such, the efficiency enhancement is restricted by the average efficiency of the SMPA. Furthermore, the use of a linearization technique is required in order to recover the linearity of multi-level DSM based transmitters.

SUMMARY

According to one broad aspect of the present specification, there is provided a level de-multiplexed DSM based transmitter, including a digital processing block, a signal up-conversion block, and a signal amplification block. The digital processing block is adapted to digitally condition a digital input signal and to generate (m−1) signal streams. The digital processing block has an input and (m−1) outputs. The signal up-conversion block has (m−1) inputs and (m−1) outputs. The inputs of the signal up-conversion block are connected to the outputs of the digital processing block. The signal up-conversion block is adapted to generate (m−1) constant envelope RF signals based on digital signals obtained from the digital processing block. The signal amplification block has (m−1) inputs and one output. The inputs of the signal amplification block are connected to the outputs of the signal up-conversion block. The signal amplification block is adapted to amplify the RF signals present at its inputs.

In some embodiments, the digital processing block includes a signal components separator, a signal components interpolator, and an m-level DSM unit. In some embodiments, the m-level DSM unit comprises one of either first m-level de-multiplexed DSM and first and second m-level de-multiplexed DSMs. In some embodiments, the m-level de-multiplexed DSM of the m-level DSM unit includes one of either (m−1) quantizers and one quantizer followed by (m−1) comparators. In some embodiments, the signal up-conversion block comprises (m−1) BLMs, and one of an (m−1) single-channel up-converters and an (m−1)-channel up-converter. In some embodiments, the signal amplification block comprises (m−1) SMPAs, each one of the (m−1) SMPAs having an input, an output, a size, and a power handling. In some embodiments, at least two of the (m−1) SMPAs of the signal amplification block have at least one of substantially identical size and substantially identical power handling. In some embodiments, at least two of the (m−1) SMPAs of the signal amplification block are connected in back-to-back configuration. In some embodiments, at least one of the (m−1) SMPAs of the signal amplification block is operated in saturation most of the time. In some embodiments, at least one of the (m−1) SMPAs of the signal amplification block provides a saturated output power higher than that of at least another of the (m−1) SMPAs of the signal amplification block. In some embodiments, the transmitter is substantially linear. In some embodiments, the (m−1) outputs of the digital processing block are m-level de-multiplexed such that there is substantially no time overlapping between at least two of the (m−1) outputs. In some embodiments, m is greater than 2. In some embodiments, m is 3. In some embodiments, level de-multiplexed DSM based transmitter includes a band pass filter connected at the output of the signal amplification block.

According to another broad aspect of the present specification, there is provided a method of level de-multiplexed DSM based transmission, including the steps of: providing a digital processing block, providing a signal up-conversion block, and providing a signal amplification block. The digital processing block is adapted to digitally condition a digital input signal and to generate (m−1) signal streams. The digital processing block has an input and (m−1) outputs. The signal up-conversion block has (m−1) inputs and (m−1) outputs. The inputs of the signal up-conversion block are connected to the outputs of the digital processing block. The signal up-conversion block is adapted to generate (m−1) constant envelope RF signals based on digital signals obtained from the digital processing block. The signal amplification block has (m−1) inputs and one output. The inputs of the signal amplification block are connected to the outputs of the signal up-conversion block. The signal amplification block is adapted to amplify the RF signals present at its inputs.

BRIEF DESCRIPTION OF THE DRAWINGS

The present specification will become more fully understood from the detailed description and the accompanying drawings, wherein.

DETAILED DESCRIPTION

Broadly the present specification enables a person of skill in the art to realize a wireless transmitter that includes multi-level de-multiplexed DSM. At least one of the efficiency and linearity of transmitters can be enhanced as required for specific applications by a person of skill in the art in view of this specification and the teachings of its disclosed embodiments. In this specification, a three-level de-multiplexed DSM based transmitter is used in many examples. It should be understood that the detailed description and specific examples related to the three-level de-multiplexed DSM based transmitter, while indicating the preferred embodiment of the specification, are intended for purposes of illustration only and are not intended to limit the scope of the specification.

Figure 1:
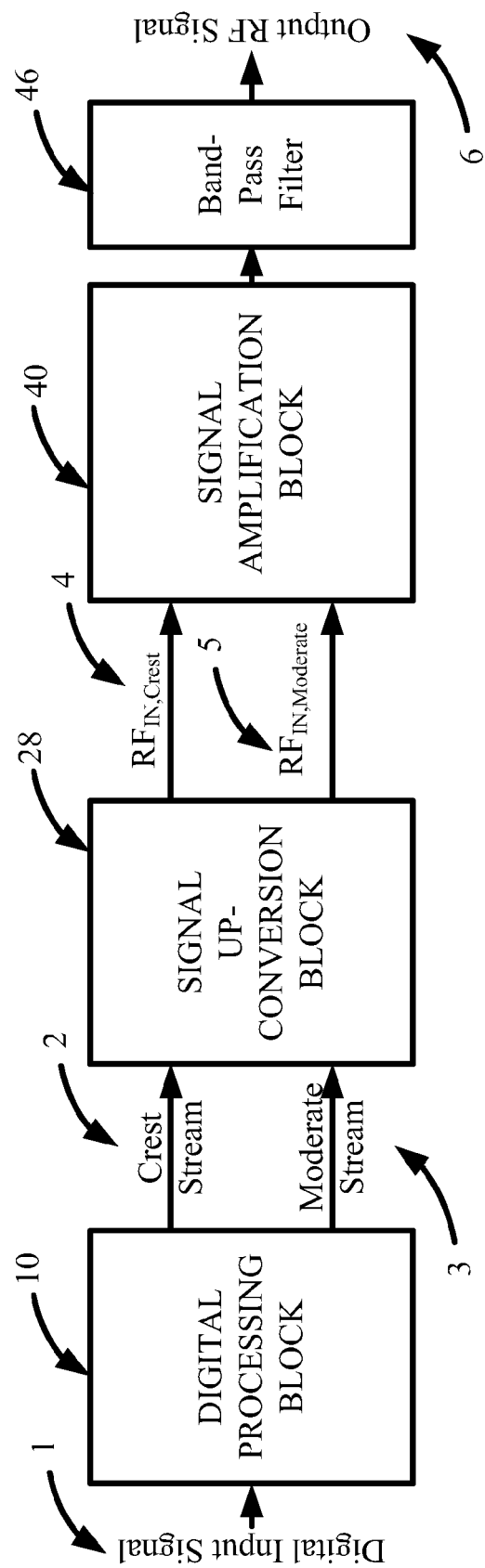
FIG. 1 is a block diagram of a three-level de-multiplexed DSM based transmitter according to an exemplary embodiment of the present specification including a three-level de-multiplexed DSM.
Figure 2:
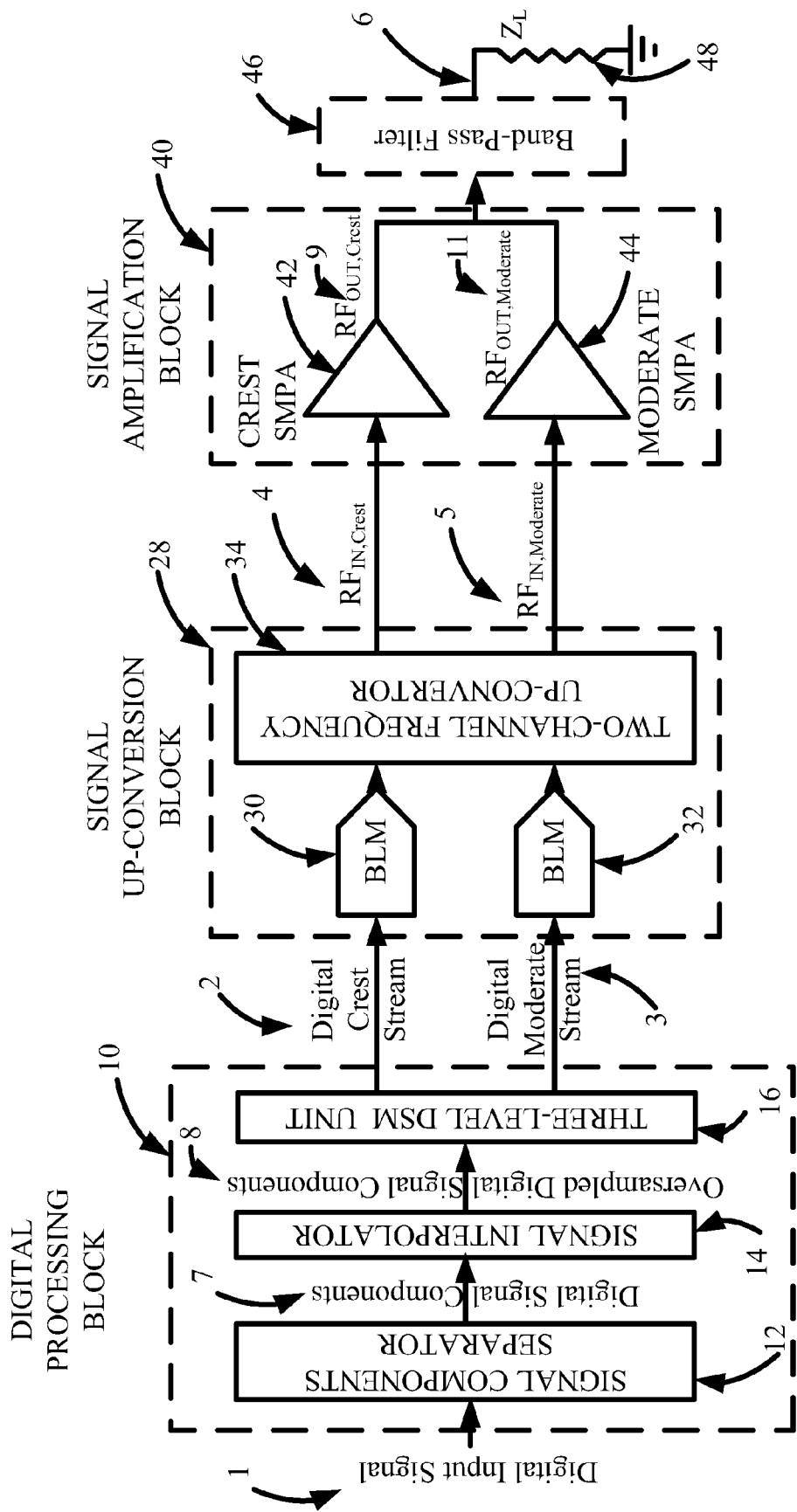
FIG. 2 is a block diagram of a more detailed view of the transmitter of FIG. 1, including one two-channel frequency up-converter, according to an exemplary embodiment of the present specification.
Figure 3:
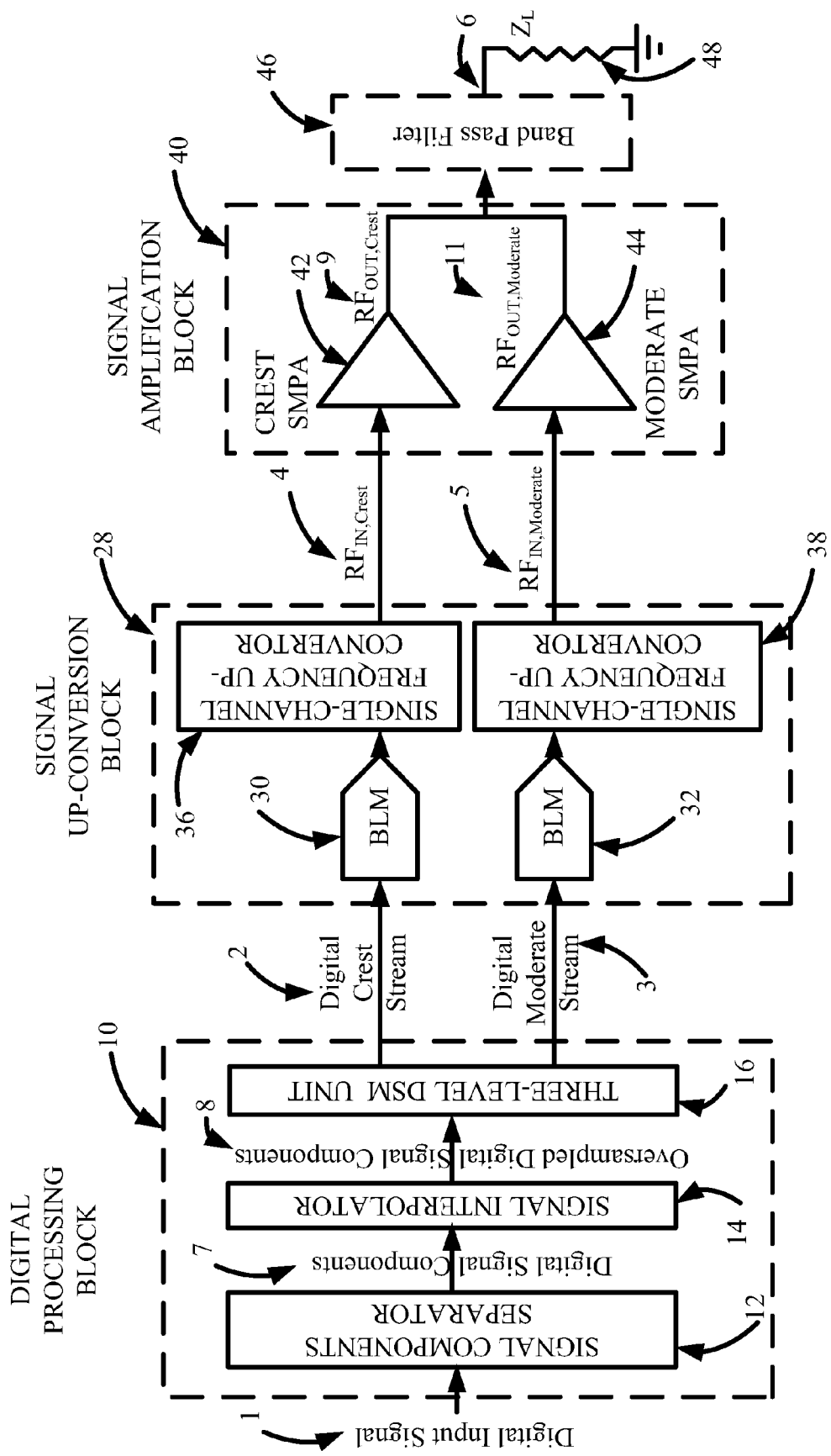
FIG. 3 is a block diagram of a more detailed alternative view of the transmitter of FIG. 1, including two single-channel frequency up-converters, according to an exemplary embodiment of the present specification.

Referring to the drawings, FIG. 1 is a block diagram of a three-level de-multiplexed DSM based transmitter according to an exemplary embodiment of the present specification including a three-level de-multiplexed DSM. FIG. 2 is a block diagram of a more detailed view of the transmitter of FIG. 1, including one two-channel frequency up-converter, according to an exemplary embodiment of the present specification. FIG. 3 is a block diagram of a more detailed alternative view of the transmitter of FIG. 1, including two single-channel frequency up-converters, according to an exemplary embodiment of the present specification.

As shown in FIGS. 1-3, a three-level de-multiplexed DSM based transmitter includes digital signal processing block 10, signal up-conversion block 28, signal amplification block 40, and an optional band-pass filter 46.

A Digital Input Signal 1 is received at the input of Digital Processing Block 10, that provides at its output, Crest Stream 2 and Moderate Stream 3. The streams 2,3 at the output of the Digital Processing Block 10 are provided at the input of Signal Up-Conversion Block 28 and up-converted into $RF_{IN}$ signals $RF_{IN,Crest}$ 4 and $RF_{IN,Moderate}$ 5. The $RF_{IN}$ signals 4, 5 are provided at the input of Signal Amplification Block 40 the output of which is optionally filtered to provide Output RF Signal 6 by the optional Band Pass Filter 46. Although not expressly shown in the drawings, in an alternative embodiment, the Signal Amplification Block 40 provides the Output RF Signal 6 such that the optional Band Pass Filter 46 is not needed.

Referring to FIGS. 2-3, Digital processing block 10 includes signal components separator 12, signal interpolator 14, and three-level DSM unit 16.

Signal components separator 12 generates the components from the received digital input signal 1, to provide Digital Signal Components 7. In case a Cartesian representation is considered, the signal components separator 12 generates two components, namely in-phase (I) and quadrature (Q). If a polar representation is wanted, the signal components separator 12 generates two components, namely envelope (E) and phase (Φ). In the case of complex representation, the output of the signal components separator 12 is one complex digital signal (I+j*Q).

The Digital Signal Components 7 generated by signal components separator 12 are oversampled to the desired oversampling ratio (OSR) by signal interpolator 14 to produce Oversampled Digital Signal Components 8. The OSR directly impacts the linearity of DSM based transmitters. Advantageously, the higher the OSR, the better the linearity. The oversampled digital signal components are delivered to the three-level DSM unit 16.

In alternative embodiments, the three-level DSM unit 16 includes one or two three-level de-multiplexed DSMs. In case the oversampled digital signal components 8 are represented in Cartesian domain, the three-level DSM unit 16 can include two three-level de-multiplexed DSMs. Alternatively, the three-level DSM unit 16 can include one three-level de-multiplexed DSM. In principle, a three-level DSM generates a quantized signal with three different levels namely, Crest level, Moderate level, and Zero level. These levels are de-multiplexed (e.g., split) in the three-level DSM unit 16 in order to generate two streams, namely Crest stream 2 and Moderate stream 3. Crest stream 2 contains the Crest and Zero levels whereas the Moderate stream 3 contains Moderate and Zero levels. The level de-multiplexing is performed such that there is preferably no time overlapping between the two streams.

Figure 4:
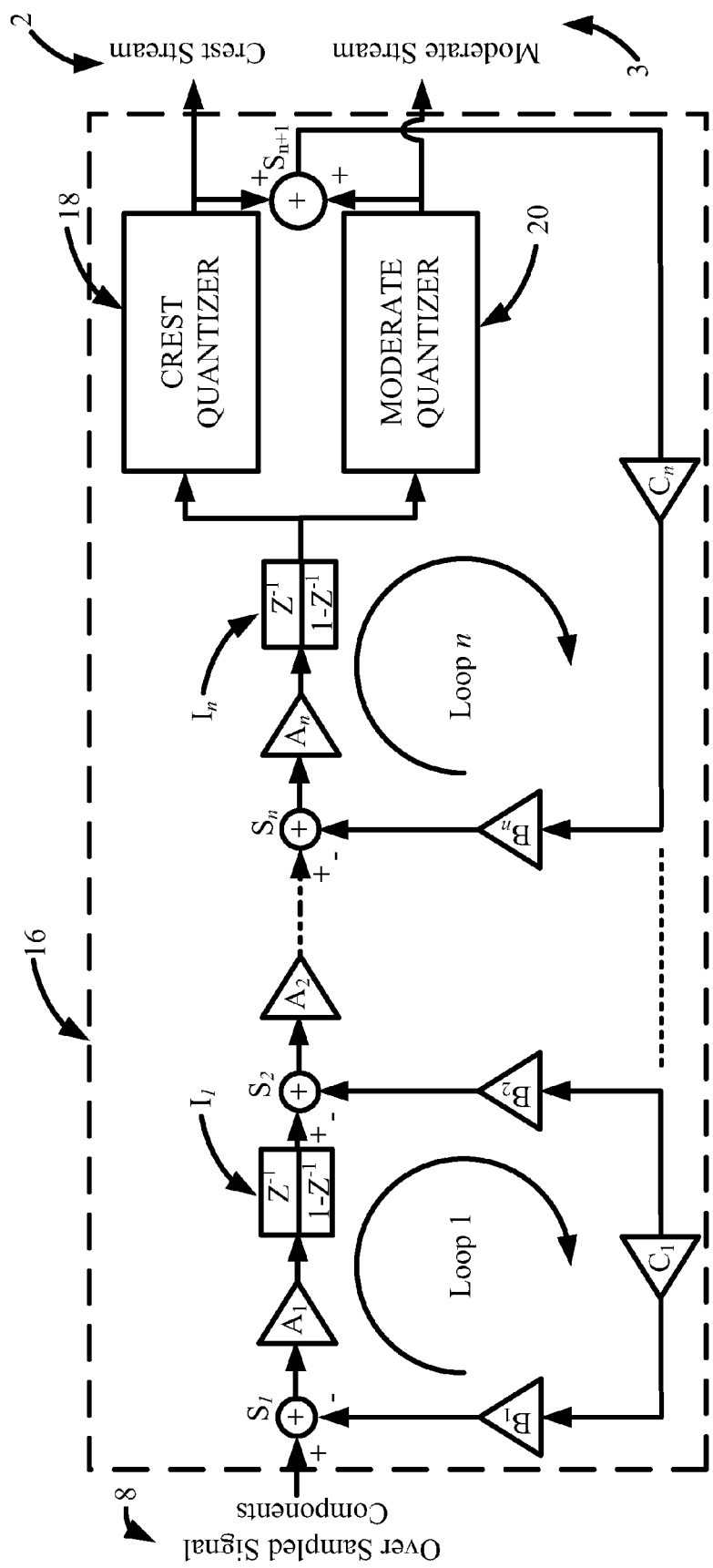
FIG. 4 is a block diagram of an example topology for the three-level DSM unit of FIG. 1, including one three-level de-multiplexed DSM with two quantizers, according to an exemplary embodiment of the present specification.

FIG. 4 is a block diagram of an example topology for the three-level DSM unit 16 of FIG. 1, including one $n^{th}$ order three-level de-multiplexed DSM with two quantizers, according to an exemplary embodiment of the present specification. As shown in FIG. 4, according to an exemplary embodiment of the present specification, the three-level DSM unit 16 includes n integrator loops Loop 1, Loop 2, . . . Loop n followed by two quantizers, namely Crest quantizer 18 and Moderate quantizer 20 which generate the Crest stream 2 and Moderate stream 3, respectively.

The $i^{th}$ integrator Loop i, where i varies from 1 to n, may include gain blocks ($A_i$, $B_i$, and $C_i$), which control the stability of the $n^{th}$ order three-level DSM, and an integrator, $I_n$. The integrator loops Loop 1, Loop 2, ... Loop n are connected to each other via Subtractors $S_1$, $S_2$, ... $S_n$ and to the quantizers by Summator $S_{n+1}$.

Figure 5:
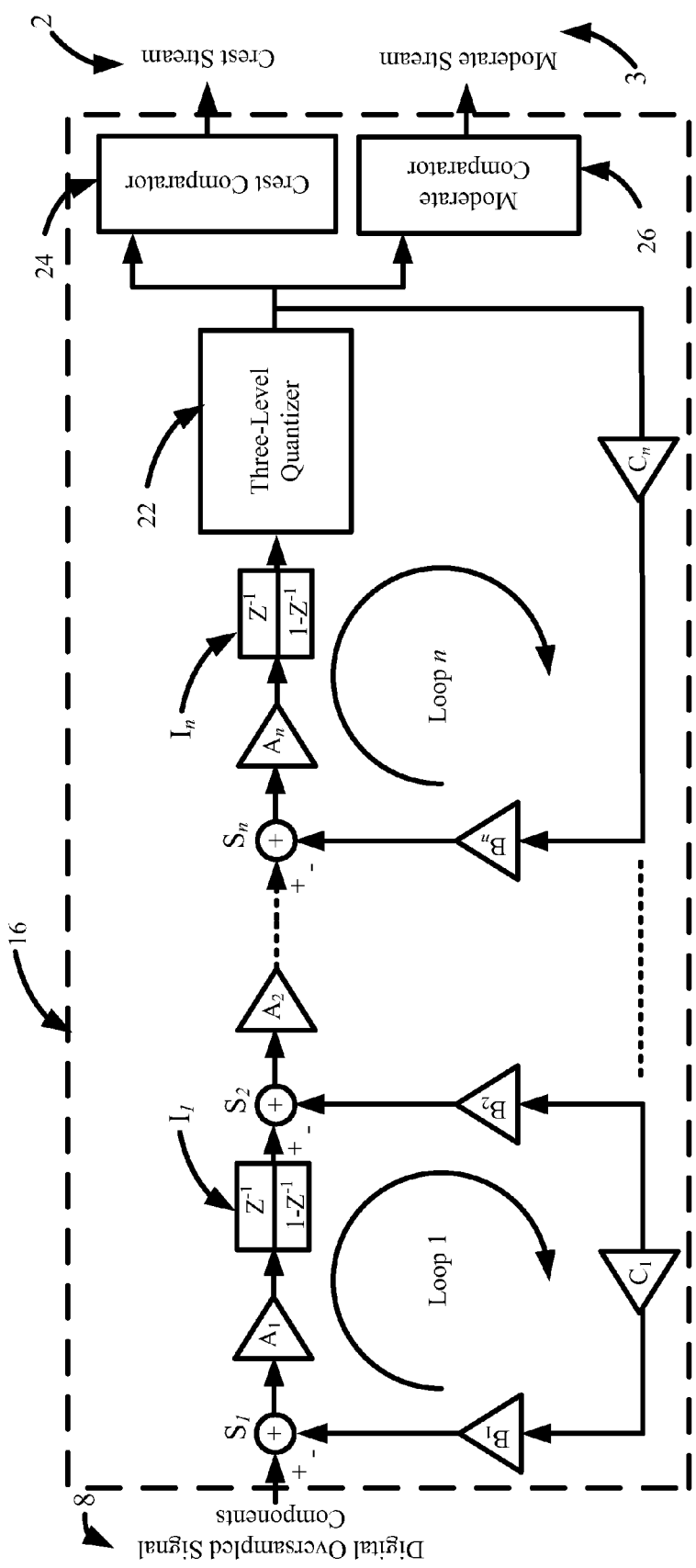
FIG. 5 is a block diagram of another example topology for the three-level DSM unit of FIG. 1, including one three-level de-multiplexed DSM with one three-level quantizer followed by two comparators, according to an exemplary embodiment of the present specification.

FIG. 5 is a block diagram of another example of a possible topology for the three-level DSM unit of FIG. 1, including one $n^{th}$ order three-level de-multiplexed DSM with one three-level quantizer followed by two comparators, according to an exemplary embodiment of the present specification. As shown in FIG. 5, according to exemplary embodiment of the present specification, the three-level DSM unit 16 includes n integrator loops followed by one three-level quantizer 22 and two comparators, namely Crest comparator 24 and Moderate comparator 26 which generate the digital Crest stream 2 and digital Moderate stream 3, respectively.

The $i^{th}$ integrator loop, where i varies from 1 to n, may include gain blocks ($A_i$, $B_i$, and $C_i$), which control the stability of the $n^{th}$ order three-level DSM, and an integrator, $I_n$. The integrator loops Loop 1, Loop 2, ... Loop n are connected to each other via Subtractors $S_1$, $S_2$, ... $S_n$.

In the case of three-level DSM, in Cartesian representation, every digital Crest stream and digital Moderate stream can be represented using two bits. While, in the case of envelope and complex representation, due to different phase values, every digital Crest stream and digital Moderate stream can be represented using more than two bits.

Returning to FIG. 2, Digital Crest 2 and Moderate 3 streams are frequency up-converted to the desired RF carrier frequency by signal up-conversion block 28. The signal up-conversion block 28 includes two bit-level-mapper (BLM) units 30 and 32 and one two-channel frequency up-convertor 34. The BLM units 30 and 32 map the bits of the digital Crest stream 2 and Digital Moderate stream 3 to three-level signals. In alternative embodiments, examples of the BLM units 30 and 32 include two bits digital to analog converter (DAC), two switches, or three-state logic circuit. It should be understood that the specific examples related to the BLM units 30 and 32 are intended for purposes of illustration only and are not intended to limit the scope of the BLM units or embodiments provided in accordance with this specification.

The signal up-conversion block 28 generates two RF signals, namely $RF_{IN,Crest}$ 4 and $RF_{IN,Moderate}$ 5. $RF_{IN,Crest}$ 4 is the up-converted version of the Crest stream 2 whereas $RF_{IN,Moderate}$ 5 is the up-converted version of the Moderate stream 3. $RF_{IN,Crest}$ 4 and $RF_{IN,Moderate}$ 5 are constant-envelope signals.

The output signals of signal up-conversion block 28, $RF_{IN,Crest}$ 4 and $RF_{IN,Moderate}$ 4, are conveyed to signal amplification block 40 which is responsible for boosting their power before transmission.

Signal amplification block 40 includes two SMPAs, namely Crest SMPA 42 and Moderate SMPA 44. Crest SMPA 42 takes $RF_{IN,Crest}$ 4 and generates $RF_{OUT,Crest}$ 9 whereas Moderate amplifier 44 takes $RF_{IN,Moderate}$ 5 and generates $RF_{OUT,Moderate}$ 11. Since $RF_{IN,Crest}$ 4 and $RF_{IN,Moderate}$ 5 are constant-envelope signals, Crest SMPA 42 and Moderate SMPA 44 can be advantageously operated at saturation. Hence, the efficiency of the overall transmitter can be advantageously improved.

The efficiency of the three-level de-multiplexed DSM based transmitter ($\eta_T$) is given by:

$$\eta_T = CE \times (\overline{P}_{Crest} \times \eta_{SATCrest} + \overline{P}_{Moderate} \times \eta_{SATModerate})$$

where CE is the coding efficiency of the three-level DSM unit 16, $\overline{P}_{Crest}$ is the probability of occurrence of the Crest level in the three-level quantized signal before de-multiplexing, and $\overline{P}_{Moderate}$ is the probability of occurrence of the Moderate level in the three-level quantized signal before de-multiplexing. $\eta_{SATCrest}$ and $\eta_{SATModerate}$ are the efficiencies of Crest SMPA 42 and Moderate SMPA 44 at saturation, respectively.

Crest SMPA 42 provides a saturated output power higher than that of Moderate SMPA 44. The difference in output power between the two SMPAs is given by the power difference between the Crest level and the Moderate level. Therefore, the transmitter is advantageously linear, and further advantageously no linearization technique is required.

Advantageously, embodiments of the level de-multiplexed DSM based transmitter are enabled to have both the advantages of two-level based DSM transmitters (e.g., quantized signals are constant-envelope; no linearity issues) and the advantages of multi-level DSM based transmitters (e.g., high CE of the quantized signal).

Since the level de-multiplexing technique ensures no time overlapping between $RF_{IN,Crest}$ 4 and $RF_{IN,Moderate}$ 5, Crest SMPA 42 and Moderate SMPA 44 work in toggling mode. In other words, when Crest SMPA 42 is ON (e.g. active), Moderate SMPA 44 is OFF (e.g., inactive) and vice versa. Therefore, they can be directly connected in back-to-back configuration. Furthermore, in order to ensure best possible performance, the two SMPAs are designed such that the power of the output RF signal from the active SMPA is totally conveyed to the input of the nonobligatory band-pass filter 46. A load is illustrated by $Z_L$ 48.

Referring to FIG. 3, an alternative to the two-channel up-convertor 34 of FIG. 2 is shown. In FIG. 3, the signal up-conversion block 28 includes two bit-level-mapper (BLM) units 30 and 32 and two single-channel up-convertors 36 and 38, instead of one two-channel frequency up-convertor 34 shown in FIG. 2.

Figure 6:
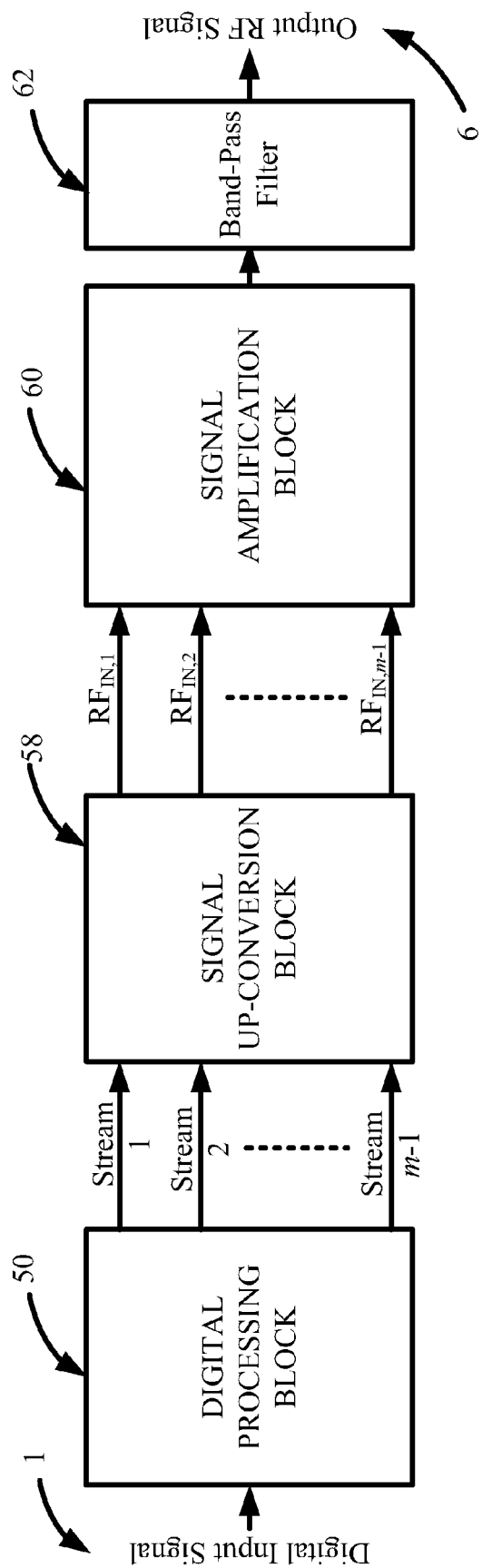
FIG. 6 is a block diagram of an m-level de-multiplexed DSM based transmitter, according to an exemplary embodiment of the present specification.

FIG. 6 is a block diagram of an m-level de-multiplexed DSM based transmitter, according to an exemplary embodiment of the present specification. Generalizing from three- to m-level de-multiplexed can advantageously further boost the CE.

A Digital Input Signal 1 is received at the input of Digital Processing Block 50, that provides at its output (m−1) Digital Streams Digital Stream 1, Digital Stream 2, ... Digital Stream (m−1). The (m−1) Digital Streams at the output of the Digital Processing Block 50 are provided at the input of Signal Up-Conversion Block 58 and up-converted into (m−1) $RF_{IN}$ signals $RF_{IN,1}$, $RF_{IN,2}$ ... $RF_{IN,(m-1)}$. The (m−1) $RF_{IN}$ signals are provided at the input of Signal Amplification Block 60 the output of which is filtered to provide Output RF Signal 6 by optional Band Pass Filter 62. Although not expressly shown in the drawings, in an alternative embodiment, the Signal Amplification Block 60 provides the Output RF Signal 6 such that the optional Band Pass Filter 62 is not needed.

Figure 7:
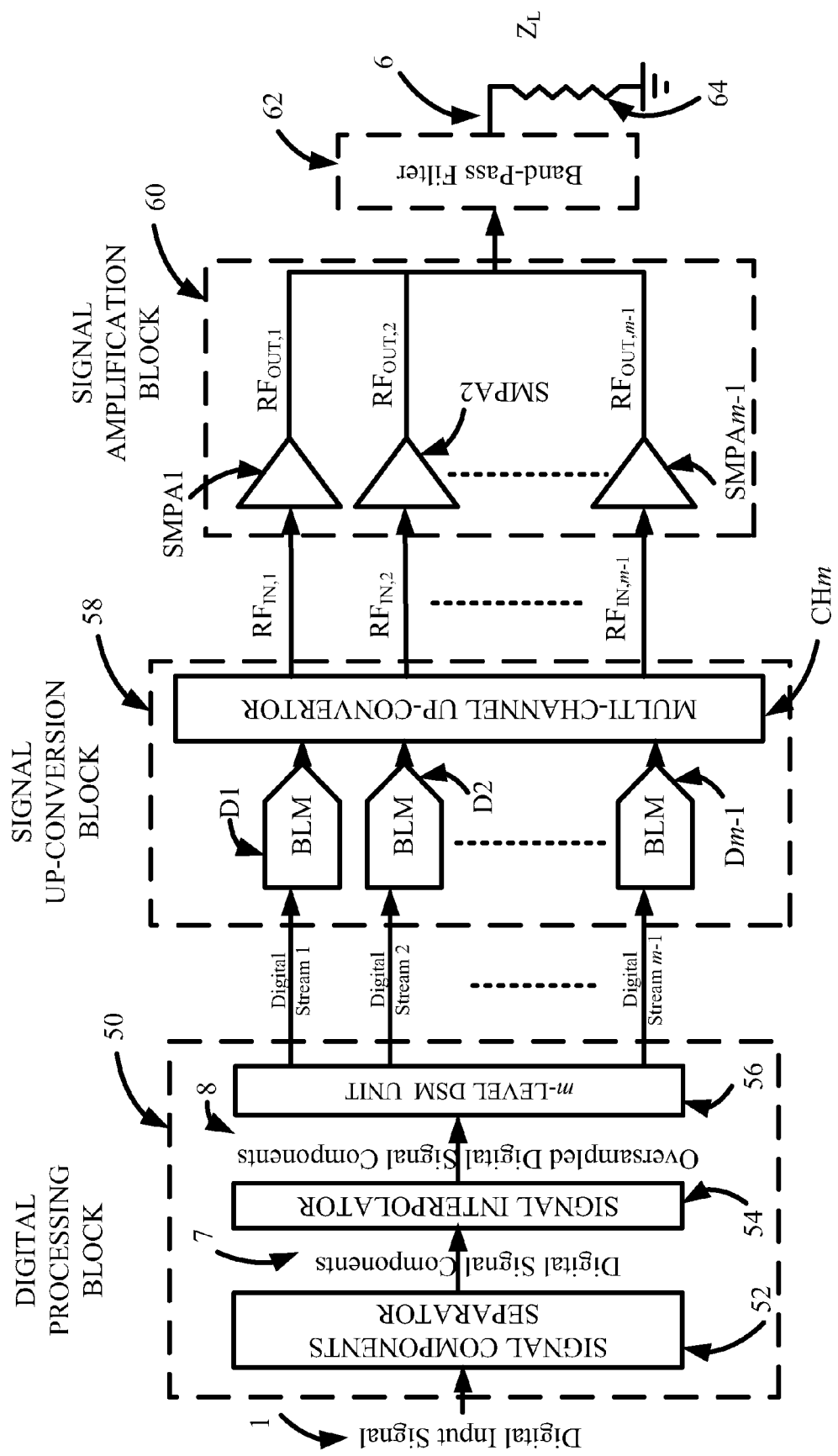
FIG. 7 is a block diagram of a more detailed view of the transmitter of FIG. 6, including one (m−1)-channel frequency up-converter, according to an exemplary embodiment of the present specification.
Figure 8:
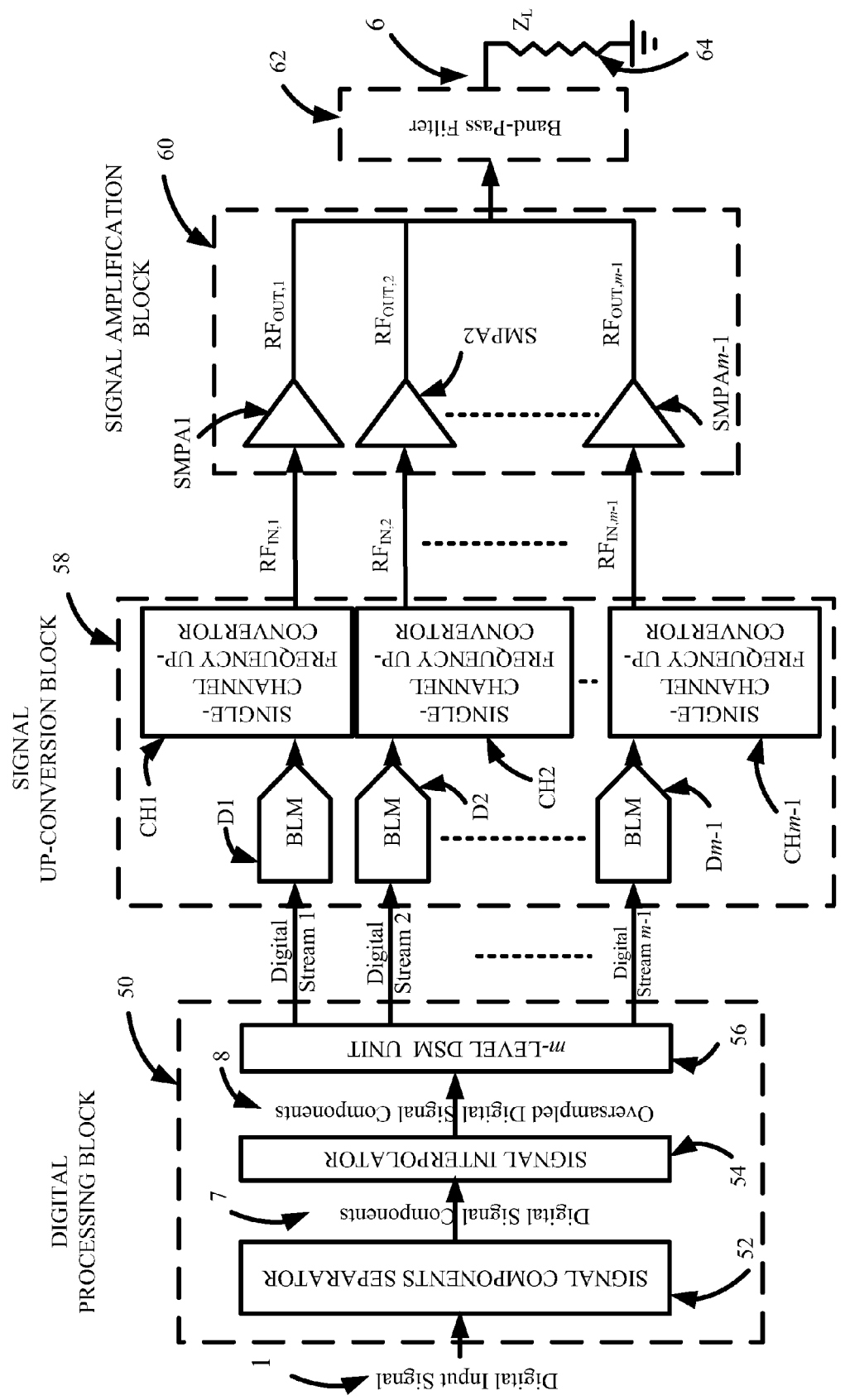
FIG. 8 is a block diagram of a more detailed alternative view of the transmitter of FIG. 6, including (m−1) single-channel frequency up-converters, according to an exemplary embodiment of the present specification.

FIGS. 7-8 show alternative block diagrams of m-level de-multiplexed DSM based transmitter of FIG. 6. FIG. 7 is a block diagram of a more detailed view of the transmitter of FIG. 6, including one (m−1)-channel frequency up-converter, according to an exemplary embodiment of the present specification. FIG. 8 is a block diagram of a more detailed alternative view of the transmitter of FIG. 6, including (m−1) single-channel frequency up-converters.

Signal components separator 52 generates the components from the received digital input signal 1, to provide Digital Signal Components 7. In case a Cartesian representation is considered, the signal components separator 52 generates two components, namely in-phase (I) and quadrature (Q). If a polar representation is wanted, the signal components separator 52 generates two components, namely envelope (E) and phase (Φ). In the case of complex representation, the output of the signal components separator 52 is one complex digital signal (I+j*Q).

The Digital Signal Components 7 generated by signal components separator 52 are oversampled to the desired oversampling ratio (OSR) by signal interpolator 54 to produce Oversampled Digital Signal Components 8. The OSR directly impacts the linearity of DSM based transmitters. The higher the OSR, the better the linearity. The oversampled digital signal components are delivered to the m-level DSM unit 56.

Figure 9:
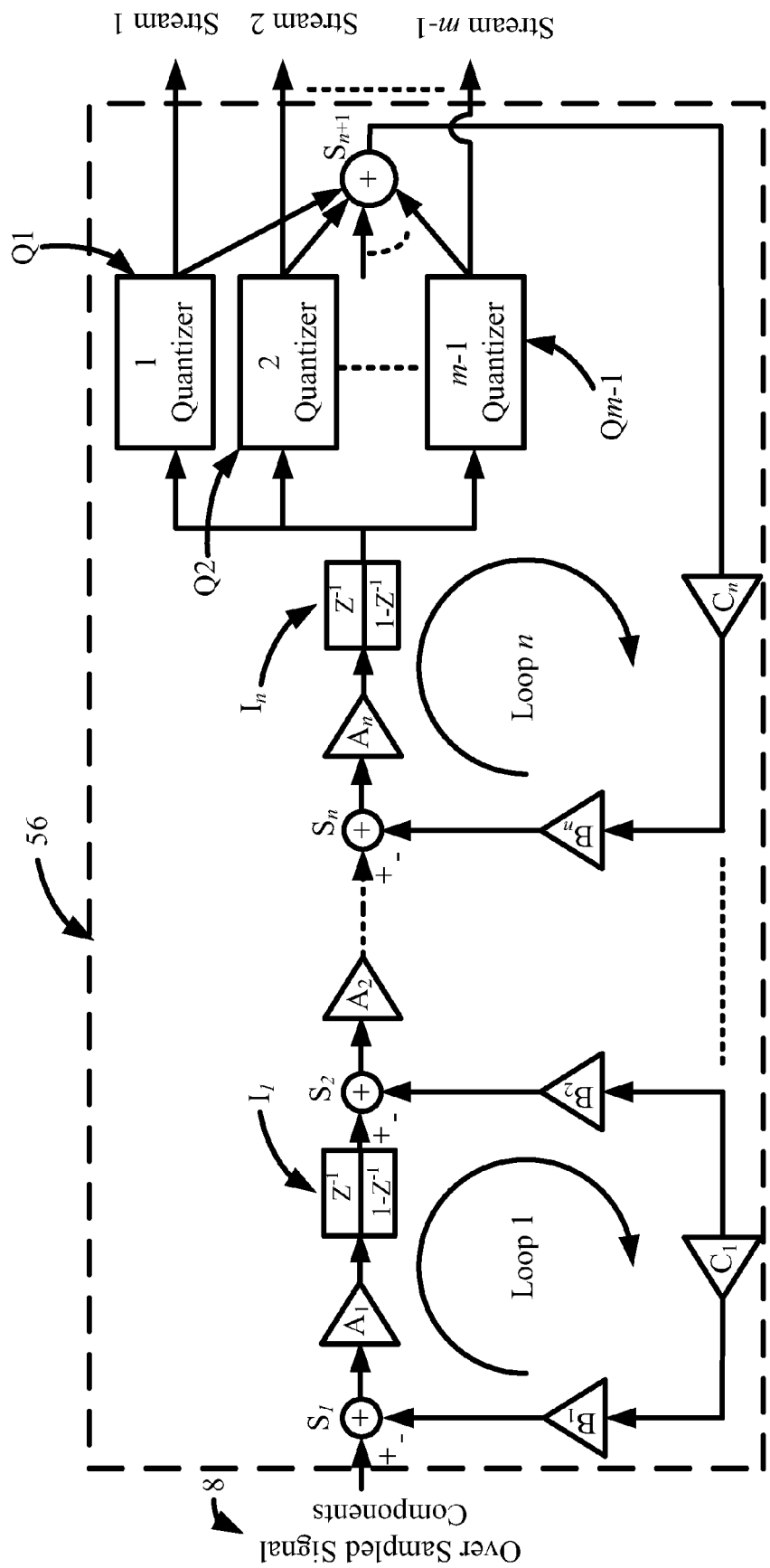
FIG. 9 is a block diagram of an example topology for the m-level DSM unit of the transmitter of FIG. 6, including one $n^{th}$ order m-level de-multiplexed DSM with (m−1) quantizers, according to an exemplary embodiment of the present specification.
Figure 10:
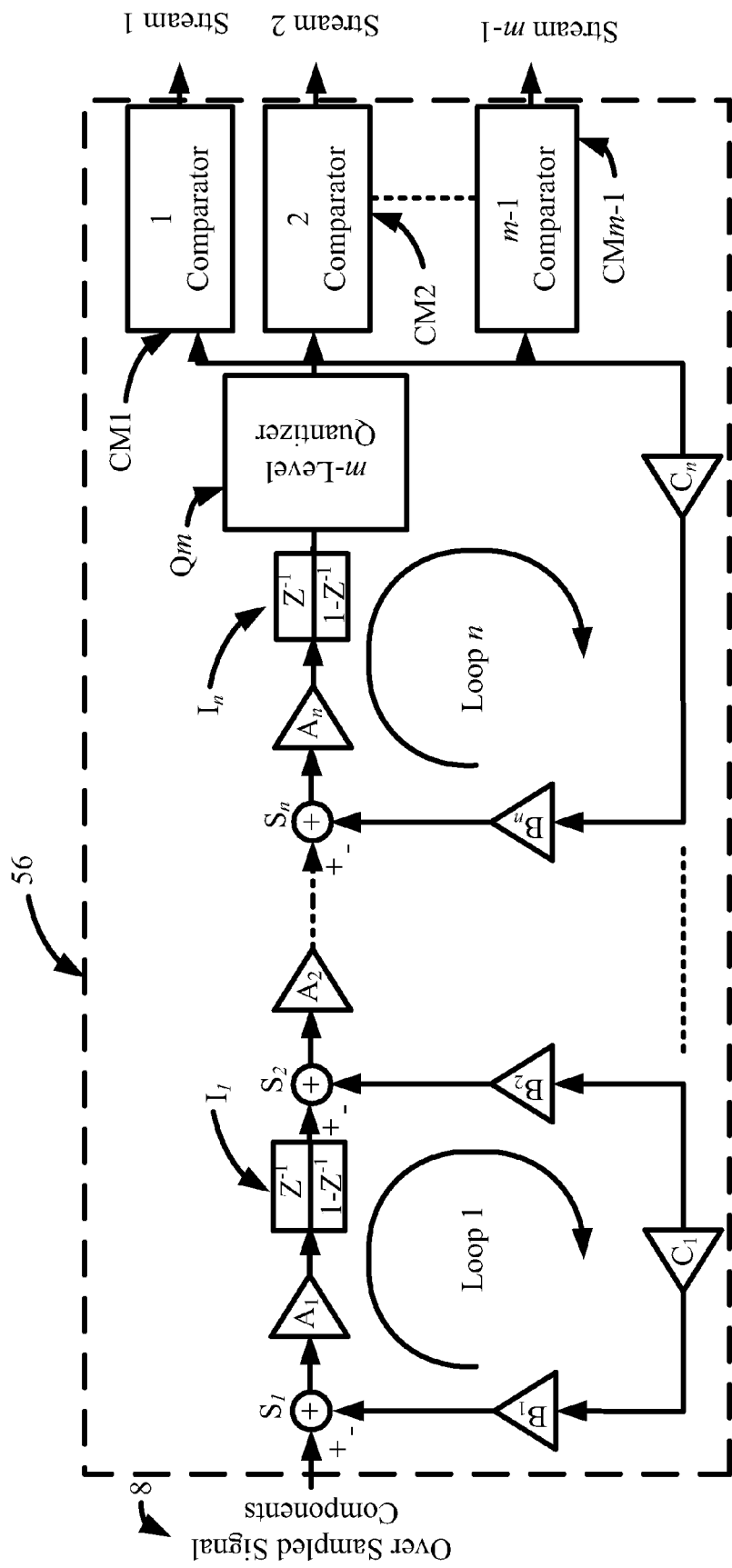
FIG. 10 is a block diagram of another example topology for the m-level DSM unit of the transmitter of FIG. 6, including one $n^{th}$ order m-level de-multiplexed DSM with one m-level quantizer followed by (m−1) comparators, according to an exemplary embodiment of the present specification.

FIGS. 9-10 show the block diagrams of two m-level de-multiplexed DSMs according to two exemplary embodiments of the m-level DSM unit 56.

FIG. 9 is a block diagram of an example topology for the m-level DSM unit 56 of the transmitter of FIGS. 6-7 including one $n^{th}$ order m-level de-multiplexed DSM which includes n integrator loops Loop 1, Loop 2, . . . Loop n followed by (m−1) quantizers $Q_1, Q_2, \ldots Q_{m-1}$, according to an exemplary embodiment of the present specification. The $i^{th}$ integrator loop, where i varies from 1 to n, may include gain blocks ($A_i$, $B_i$, and $C_i$), which control the stability of the $n^{th}$ order three-level DSM and an integrator, $I_n$. The integrator loops Loop 1, Loop 2, . . . Loop n are connected to each other via Subtractors $S_1, S_2, \ldots S_n$ and to the quantizers $Q_1, Q_2, \ldots Q_{m-1}$ by Summator $S_{n+1}$.

FIG. 10 is a block diagram of another example topology of the m-level DSM unit 56 of the transmitter of FIGS. 6-7 including one $n^{th}$ order m-level de-multiplexed DSM which includes n integrator loops Loop 1, Loop 2, . . . Loop n followed by one m-level quantizer $Q_m$ followed by (m−1) comparators CM1, CM2, . . . , CMm−1, according to an exemplary embodiment of the present specification. The $i^{th}$ integrator loop, where i varies from 1 to n, may include gain blocks ($A_i$, $B_i$, and $C_i$), which control the stability of the $n^{th}$ order three-level DSM and an integrator, $I_n$. The integrator loops Loop 1, Loop 2, . . . Loop n are connected to each other via Subtractors $S_1, S_2, \ldots S_n$.

Returning to FIG. 7, Digital Streams Digital Stream 1, Digital Stream 2, . . . Digital Stream (m−1) are frequency up-converted to the desired RF carrier frequency by signal up-conversion block 58. The signal up-conversion block 58 includes (m−1) bit-level-mapper (BLM) units D1, D2, . . . Dm−1 and a multi-channel frequency up-convertor CHm. The BLM units D1, D2, . . . Dm−1 map the bits of the Digital Streams Digital Stream 1, Digital Stream 2, . . . Digital Stream m−1 to three-level signals. In alternative embodiments, examples of the BLM units D1, D2, . . . Dm−1 include two bits digital to analog converter (DAC), two switches, or three-state logic circuit. It should be understood that the specific examples related to the BLM units D1, D2, . . . Dm−1 are intended for purposes of illustration only and are not intended to limit the scope of the BLM units or embodiments provided in accordance with this specification.

The signal up-conversion block 58 generates (m−1) RF signals, namely $RF_{IN,1}, RF_{IN,2} \ldots RF_{IN,m-1}$, each being the up-converted version of the Digital Stream 1, Digital Stream 2, . . . Digital Stream (m−1) respectively. $RF_{IN,1}, RF_{IN,2} \ldots RF_{IN,m-1}$ are constant-envelope signals.

The output signals of signal up-conversion block 58, $RF_{IN,1}, RF_{IN,2} \ldots RF_{IN,m-1}$, are conveyed to signal amplification block 60 which is responsible for boosting their power before transmission.

Signal amplification block 60 includes (m−1) SMPAs, namely SMPA1, SMPA2, . . . SMPAm−1. SMPA1, SMPA2, . . . SMPAm−1 generate $RF_{OUT,1}, RF_{OUT,2}, \ldots RF_{OUT,m-1}$, respectively. Since $RF_{IN,1}, RF_{IN,2} \ldots RF_{IN,m-1}$ are constant-envelope signals, SMPA1, SMPA2, . . . SMPAm−1 can be advantageously operated at saturation. Hence, the efficiency of the overall transmitter can be advantageously improved.

Referring to FIG. 8, an alternative to the multi-channel up-convertor CHm of FIG. 7 is shown. In FIG. 8, the signal up-conversion block 58 includes (m−1) single-channel frequency up-convertors CH1, CH2, . . . CHm−1, instead of one multi-channel frequency up-convertor CHm shown in FIG. 7.

While the specification has described several embodiments, those skilled in the art will recognize that the invention is not limited to the embodiments described; it can be practiced with modification and alteration within the scope of the appended claims. The specification is thus to be regarded as illustrative instead of limiting.

What is claimed is:

1. A level de-multiplexed Delta Sigma Modulator (DSM) based transmitter, comprising:
  a. an m-level DSM unit, wherein m is an integer greater than or equal to 3, the DSM unit adapted to quantize an input signal into m−1 non-Zero quantization levels and a Zero level, the DSM unit further adapted to generate (m−1) de-multiplexed signal streams with substantially no time overlap between any two signal streams, each signal stream having a Zero-level component and a Non-zero component, the non-zero component corresponding to one of the (m−1) non-Zero quantization levels;
  b. a signal up-conversion block, adapted to receive the (m−1) de-multiplexed signal streams from the m-level DSM unit and to frequency up-convert the (m−1) signal streams into (m−1) radio frequency (RF) signals; and
  c. a signal amplification block adapted to receive the (m−1) RF signals, to amplify the (m−1) RF signals into (m−1) amplified signals and to combine the (m−1) amplified signals into an output signal.

2. The level de-multiplexed DSM based transmitter of claim 1, wherein the m-level DSM unit is within a digital processing block further comprising a signal components separator adapted to receive a time-varying input signal and to extract components of the time-varying input signal based on a selected representation, a signal components interpolator adapted to receive the components of the time—varying input signal from the signal components separator, to perform over-sampling on the component and to send the oversampled components to the DSM unit.

3. The level de-multiplexed DSM based transmitter of claim 1, wherein within the m-level DSM unit the input signal is quantized by one of either (m−1) quantizers or one quantizer followed by (m−1) comparators.

4. The level de-multiplexed DSM based transmitter of claim 1, wherein the signal up-conversion block comprises (m−1) bit level mappers (BLMs) adapted to receive the (m−1) de-multiplexed signal streams and to convert them to (m−1) baseband signals, and one of an (m−1) single-channel up-converters and an (m−1)-channel up-converter adapted to up-convert the (m−1) baseband signals to the (m−1) RF signals.

5. The level de-multiplexed DSM based transmitter of claim 1, wherein the signal amplification block comprises (m−1) switching-mode amplifiers (SMPAs), each one of the (m−1) SMPAs adapted to receive and amplify one of the (m−1) RF signals.

6. The level de-multiplexed DSM based transmitter of claim 5, wherein at least two of the (m−1) SMPAs of the signal amplification block are connected in back-to-back configuration.

7. The level de-multiplexed DSM based transmitter of claim 5, wherein at least one of the (m−1) SMPAs of the signal amplification block is operated in saturation most of the time.

8. The level de-multiplexed DSM based transmitter of claim 5, wherein at least one of the (m−1) SMPAs of the signal amplification block provides a saturated output power higher than that of at least another one of the (m−1) SMPAs of the signal amplification block.

9. The level de-multiplexed DSM based transmitter of claim 1, wherein the transmitter is substantially linear.

10. The level de-multiplexed DSM based transmitter of claim 1, further comprising a band pass filter connected at the output of the signal amplification block.

* * * * *